United States Patent
Gärditz et al.

(10) Patent No.: US 8,461,579 B2
(45) Date of Patent: Jun. 11, 2013

(54) ORGANIC RADIATION-EMITTING COMPONENT AND METHOD FOR PRODUCING AN ORGANIC RADIATION-EMITTING COMPONENT

(75) Inventors: Christoph Gärditz, Regensburg (DE); Ralf Krause, Erlangen (DE); Günter Schmid, Hemhofen (DE); Stefan Seidel, Nittendorf (DE); Oliver Weiss, Dossenheim (DE); Riikka Suhonen, Oulu (FI); Ulrich Niedermeier, Leiblfing (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/127,229

(22) PCT Filed: Oct. 22, 2009

(86) PCT No.: PCT/DE2009/001487
§ 371 (c)(1),
(2), (4) Date: Oct. 11, 2011

(87) PCT Pub. No.: WO2010/048927
PCT Pub. Date: May 6, 2010

(65) Prior Publication Data
US 2012/0025176 A1 Feb. 2, 2012

(30) Foreign Application Priority Data
Oct. 31, 2008 (DE) .......................... 10 2008 054 219

(51) Int. Cl.
*H01L 29/08* (2006.01)
*H01L 35/24* (2006.01)
*H01L 51/00* (2006.01)

(52) U.S. Cl.
USPC ............. 257/40; 257/E51.018; 257/E51.019; 257/E51.021; 257/E51.026

(58) Field of Classification Search
USPC ............. 257/40, E51.018, E51.019, E51.021, 257/E51.026
See application file for complete search history.

(56) References Cited

U.S. PATENT DOCUMENTS

| 5,015,559 | A * | 5/1991 | Ogawa ......................... 430/326 |
| 6,687,274 | B2 * | 2/2004 | Kahen ............................. 372/39 |

(Continued)

FOREIGN PATENT DOCUMENTS

| CN | 101281956 | 10/2008 |
| DE | 198 45 229 | 3/2000 |

(Continued)

OTHER PUBLICATIONS

Zhou, X. et al., "Low-voltage inverted transparent vacuum deposited organic light-emitting diodes using electrical doping", Applied Physics Letters vol. 81, No. 5, pp. 922-924, Jul. 29, 2002.

(Continued)

*Primary Examiner* — Ida M Soward
(74) *Attorney, Agent, or Firm* — Cozen O'Connor

(57) ABSTRACT

An organic radiation-emitting component, including a first electrode (1) having a first electrical contact region (10) for making electrical contact with the first electrode (1), a first organic functional layer (31) on the first electrode (1), on the first organic functional layer (31) at least one organic active region (4) suitable for emitting electromagnetic radiation during operation, and a second electrode (2) on the active region (4), wherein the first organic functional layer (31) includes a plurality of laterally arranged partial regions (30) each including a first material (51) having a first electrical conductivity and a second material (52) having a second electrical conductivity, the second electrical conductivity is greater than the first electrical conductivity, and the ratio of the proportion of the second material (52) to the proportion of the first material (51) in the partial regions (30) of the first organic functional layer (31) varies in a manner dependent on a lateral distance from the first electrical contact region (10).

15 Claims, 5 Drawing Sheets

U.S. PATENT DOCUMENTS

| | | | |
|---|---|---|---|
| 6,720,203 B2 * | 4/2004 | Carcia et al. | 438/99 |
| 6,728,278 B2 * | 4/2004 | Kahen et al. | 372/39 |
| 6,845,114 B2 * | 1/2005 | Patton et al. | 372/39 |
| 6,963,594 B2 * | 11/2005 | Manico et al. | 372/39 |
| 7,135,712 B2 * | 11/2006 | Broer et al. | 257/98 |
| 7,250,326 B2 * | 7/2007 | Kaneko et al. | 438/98 |
| 7,375,377 B2 * | 5/2008 | Baur et al. | 257/79 |
| 7,381,994 B2 * | 6/2008 | Perlo et al. | 257/79 |
| 7,399,993 B2 * | 7/2008 | Matsuda | 257/89 |
| 7,477,013 B2 * | 1/2009 | Yu et al. | 313/504 |
| 7,560,741 B2 | 7/2009 | Härle et al. | |
| 7,592,637 B2 * | 9/2009 | Zimmerman et al. | 257/98 |
| 7,872,353 B2 * | 1/2011 | Ito et al. | 257/758 |
| 7,943,418 B2 * | 5/2011 | Tombler, Jr. | 438/99 |
| 7,982,211 B2 * | 7/2011 | Buchel et al. | 257/40 |
| 8,129,098 B2 * | 3/2012 | Irving et al. | 430/324 |
| 8,154,700 B2 * | 4/2012 | Prakash et al. | 349/144 |
| 2002/0180351 A1 | 12/2002 | McNulty et al. | |
| 2004/0217348 A1 * | 11/2004 | Carcia et al. | 257/40 |
| 2005/0052119 A1 * | 3/2005 | Yu et al. | 313/503 |
| 2005/0140284 A1 * | 6/2005 | Im | 313/506 |
| 2006/0033428 A1 | 2/2006 | Yu et al. | |
| 2007/0019409 A1 | 1/2007 | Nawashiro et al. | |
| 2007/0075636 A1 | 4/2007 | Tobise | |
| 2008/0030986 A1 | 2/2008 | Ogawa et al. | |
| 2008/0079015 A1 | 4/2008 | Krummacher | |
| 2008/0197371 A1 | 8/2008 | Ottermann | |
| 2008/0246395 A1 | 10/2008 | Nakai et al. | |
| 2009/0229667 A1 * | 9/2009 | Shrotriya et al. | 136/263 |
| 2009/0261371 A1 | 10/2009 | Schindler et al. | |
| 2010/0171546 A1 * | 7/2010 | Kwok et al. | 327/537 |
| 2010/0224893 A1 | 9/2010 | Liepold | |
| 2010/0230694 A1 | 9/2010 | Arndt et al. | |
| 2011/0057170 A1 * | 3/2011 | Tsai et al. | 257/40 |
| 2013/0075712 A1 | 3/2013 | Schindler et al. | |

FOREIGN PATENT DOCUMENTS

| | | |
|---|---|---|
| DE | 103 08 866 | 9/2004 |
| DE | 10 2005 002 836 | 8/2006 |
| DE | 20 2007 007 341 | 8/2007 |
| DE | 10 2006 026 481 | 12/2007 |
| DE | 10 2007 015 474 | 10/2008 |
| EP | 1 729 350 | 12/2006 |
| EP | 1 906 462 | 4/2008 |
| EP | 1 978 574 | 10/2008 |
| WO | WO 2006/077136 | 7/2006 |
| WO | WO 2008/033405 | 3/2008 |
| WO | WO 2008/034405 | 3/2008 |

OTHER PUBLICATIONS

Zhou X. et al., "High-efficiency electrophosphorescent organic light-emitting diodes with double light-emitting layers", Applied Physics Letters vol. 81, No. 21, pp. 4070-4072, Nov. 18, 2002.

Zhou, X. et al., "Enhanced Hole Injection into Amorphous Hole-Transport Layers of Organic Light-Emitting Diodes Using Controlled p-Type Doping", Advanced Functional Materials, vol. 11, No. 4, pp. 310-314, Aug. 2001.

Kurata, T. et al., "Charge-Transporting Property of Polymer Films Doped with Organic Stable Radicals", Journal of Photopolymer Science and Technology, vol. 16, No. 2, pp. 297-298, May 28, 2003.

Endo, J. et al., "Organic Electroluminescent Devices with a Vacuum-Deposited Lewis-Acid-Doped Hole-Injection Layer", Jpn. J. Appl. Phys., vol. 41, pp. L358-L360, Mar. 15, 2002.

Gao, W. et al., "Controlled p doping of the hole-transport molecular material N,N'-diphenyl-N,N'-bis(1-naphthyl)-1,1'-biphenyl-4,4'-diamine with tetrafluorotetracyanoquinodimethane", Journal of Applied Physics, vol. 94, No. 1, pp. 359-366, Jul. 1, 2003.

Harada, K. et al., "Organic Homojunction Diodes with a High Built-in Potential: Interpretation of the Current-Voltage Characteristics by a Generalized Einstein Relation", Physical Review Letters, vol. 94, pp. 036601-1-036601-4, Jan. 28, 2005.

He, G. et al., "High-efficiency and low-voltage p-i-n electrophosphorescent organic light-emitting diodes with double-emission layers", Applied Physics Letters, vol. 85, No. 17, pp. 3911-3913, Oct. 25, 2004.

He, G. et al., "Very high-efficiency and low voltage phosphorescent organic light-emitting diodes based on a p-i-n junction", Applied Physics Letters, vol. 95, No. 10, pp. 5773-5777, May 15, 2004.

Office Action dated Feb. 4, 2013 issued in the corresponding Chinese Patent Application No. 200980143755.4.

* cited by examiner

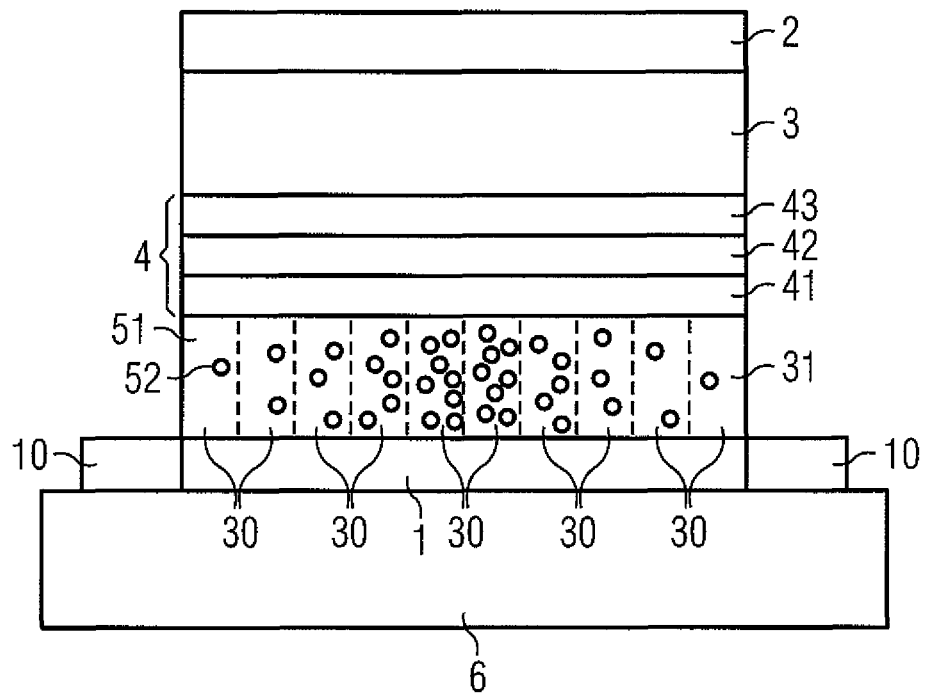
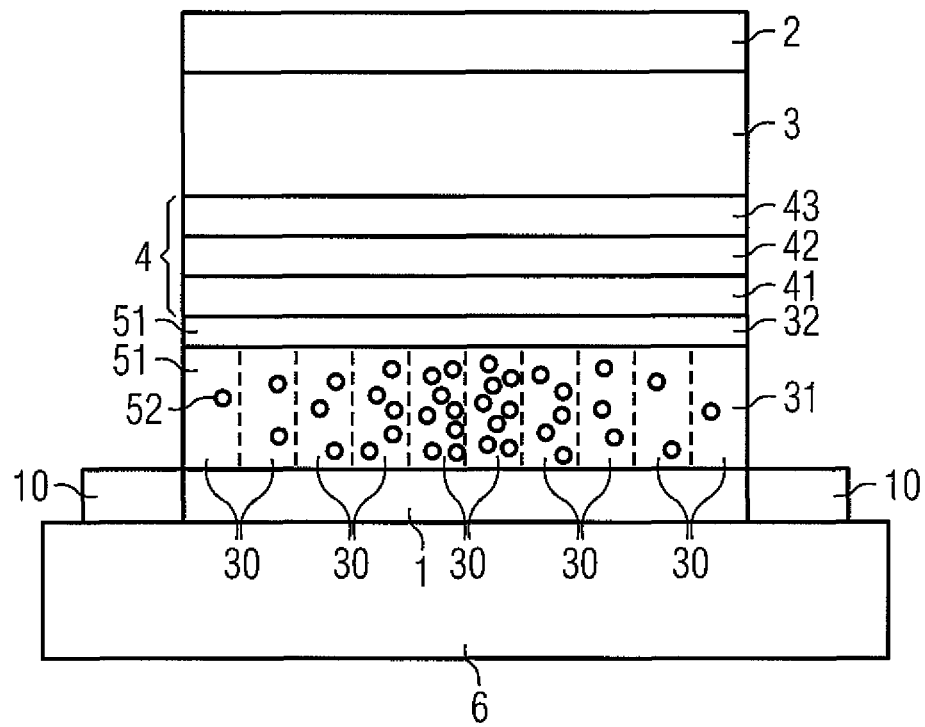

ORGANIC RADIATION-EMITTING COMPONENT AND METHOD FOR PRODUCING AN ORGANIC RADIATION-EMITTING COMPONENT

RELATED APPLICATIONS

This is a U.S. national stage of application No. PCT/DE2009/001487, filed on Oct. 22, 2009 and claims the priority of German patent application No. 10 2008 054 219.9, filed Oct. 21, 2008, the contents of which is hereby incorporated by reference.

FIELD OF THE INVENTION

An organic radiation-emitting component and a method for producing an organic radiation-emitting component are specified below.

BACKGROUND OF THE INVENTION

The use of organic light-emitting diodes (OLEDs) for illumination purposes is increasingly being discussed. Large-area OLED components having large-area electrodes are intended to be used for this purpose. However, an OLED component of this type usually has the problem that the electrical conductivity of the large-area electrodes, particularly if the OLED component has a large-area transparent electrode, is very limited. The material-dictated restricted conductivity results in a non-uniform current supply over the OLED area since the supply voltage decreases laterally over the area of the electrode. This means that edge regions are better supplied in charge carriers in comparison with regions in the center of the OLED since a voltage drop takes place along the direction of extent of the electrode. This inhomogeneity in the current distribution then immediately becomes apparent in the luminance distribution of the OLED and has the effect that the brightness decreases greatly toward the center of the OLED, which is also referred to as the so-called bathtub effect.

A difference in brightness of 10 to 20% between, for example, the edge and the center of the OLED already has an adverse effect on the external appearance in the case of known large-area OLEDs. Although increasing the thickness of a transparent large-area electrode would increase the conductivity thereof, the transparency of the electrode and thus the coupling-out efficiency of the light generated in the OLED would thereby be reduced. Moreover, thicker electrodes are cost-intensive.

SUMMARY OF THE INVENTION

At least one object of specific embodiments is to specify an organic radiation-emitting component which comprises at least one organic functional layer. Furthermore, it is an object of specific embodiments to specify a method for producing such an organic radiation-emitting component.

An organic radiation-emitting component in accordance with one embodiment comprises, in particular,
a first electrode having a first electrical contact region for making electrical contact with the first electrode,
a first organic functional layer on the first electrode,
on the first organic functional layer at least one organic active region suitable for emitting electromagnetic radiation during operation, and
a second electrode on the active region, wherein
the first organic functional layer comprises a plurality of laterally arranged partial regions each comprising a first material having a first electrical conductivity and a second material having a second electrical conductivity,
the second electrical conductivity is greater than the first electrical conductivity, and
the ratio of the proportion of the second material to the proportion of the first material in the partial regions of the first organic functional layer varies in a manner dependent on a lateral distance from the first electrical contact region.

In this case, the fact that one layer or one element is arranged or applied "on" or "above" another layer or another element can mean here and hereinafter that said one layer or said one element is arranged directly in direct mechanical and/or electrical contact on the other layer or the other element. Furthermore, it can also mean that said one layer or said one element is arranged indirectly on or above the other layer or the other element. In this case, further layers and/or elements can then be arranged between said one layer and the other layer or between said one element and the other element.

The fact that one layer or one element is arranged "between" two other layers or elements can mean here and hereinafter that said one layer or said one element is arranged directly in direct mechanical and/or electrical contact or in indirect contact with one of the two other layers or elements and in direct mechanical and/or electrical contact or in indirect contact with the other of the two other layers or elements. In this case, in the case of indirect contact, further layers and/or elements can then be arranged between said one and at least one of the two other layers or between said one and at least one of the two other elements.

The designations "radiation", "electromagnetic radiation" and "light" mean here and hereinafter electromagnetic radiation having at least one wavelength or one spectral component in an infrared to ultraviolet wavelength range. In particular, infrared, visible and/or ultraviolet light can be designated.

An "electrical contact region" for making electrical contact with or for electrically connecting an electrode can comprise or be here and hereinafter for example an electrical lead, a conductor track, an electrical connection pad, a contact wire and/or a bonding pad and be suitable for electrically connecting an electrode to a voltage and/or current supply. In this case, the electrical contact region can also be formed by a part of the electrode. In particular, the electrical contact region can be arranged in such a way that there is no direct electrical contact between the electrical contact region and organic functional layers, for example the abovementioned first organic functional layer or one of the organic functional layers mentioned and described hereinafter. An electrical contact region can be arranged, in particular, in a lateral direction alongside the first functional layer. In particular, that can mean that an electrical contact region for making electrical contact with an electrode is in direct electrical contact only with said electrode.

A "layer" can mean here and hereinafter, unless expressly described otherwise, an element whose dimensions are characterized by a main extension plane having two main extension directions and a thickness or height, wherein the thickness or height is smaller than at least one main extension direction and preferably smaller than both main extension directions.

"Lateral" can mean here and hereinafter a direction and also a relative arrangement of two elements with respect to one another which runs parallel to at least one main extension direction and particularly preferably parallel to the main extension plane of the first and second electrodes and one organic functional layer. Consequently, a lateral direction can be perpendicular to the direction of arrangement of the first electrode, the first organic functional layer, the active region and the second electrode one above another. In this sense, "one above another" can denote here and hereinafter an arrangement along a direction perpendicular to the main extension direction of the electrodes and further layers of the organic radiation-emitting component and thus be defined by the order of application of the layers one on another.

In the case of the organic radiation-emitting component described here, for the purpose of operation, a voltage or a current can be applied between the first electrical contact region and the second electrode. When expressed in a simplified manner, the partial resistance of an arbitrary imaginary current path from the first contact region to the second electrode is given by the resistances of the respective corresponding proportions of the current path in the first electrode, in the first organic layer, in the active region and, if appropriate, in further layers between the first and second electrodes. On account of all the physically and technically possible current paths through these layers, corresponding current densities with corresponding current density distributions form in the individual layers during the operation of the organic radiation-emitting component. Depending on the current density distribution in the active region, in particular the current density distribution along the main extension direction of the active region, the electromagnetic radiation generated in the active region is generated and emitted with a corresponding luminance distribution.

Since the organic radiation-emitting component described here comprises the first organic functional layer having the partial regions comprising the first and second materials having the first and the second electrical conductivity, respectively, the electrical conductivities of the partial regions can be influenced in a targeted manner depending on the relative proportions of the first and second materials with respect to one another.

In comparison therewith, in the case of known OLEDs, conductor track structures are usually arranged on one or both electrodes, which are intended to homogenize the current density distribution in the electrode or electrodes. However, such conductor tracks, which are embodied as metallizations of highly conductive metals and which can also be designated as so-called "busbars", are usually non-transparent or at least less transparent than, for example, a transparent electrode on which they are arranged. As a result, the "busbars" bring about undesired dark regions on the OLED, as a result of which the luminance and thus also the area efficiency of the OLED decrease. Therefore, in the case of known OLEDs, a reduction of the coupling-out efficiency of the light generated in the OLED has to be accepted simultaneously with the increase in the homogeneity of the current density distribution.

In the case of the organic radiation-emitting component described here, by contrast, it has surprisingly been established that an adaptation and furthermore a desired formation of the current density distribution in the active region are possible by means of the first organic functional layer having the partial regions comprising the first and second materials as described here. As a result, the partial resistances of individual (imaginary) current paths through the layers of the organic radiation-emitting component can also be adapted in a targeted manner, such that, as a result, the luminance distribution of the electromagnetic radiation generated in the active region can in turn also be adapted in a targeted manner. Therefore, in comparison with known organic components, it is possible at least to reduce the number and/or the dimensions of conductor track structures or of "busbars" on one or both electrodes and, particularly advantageously, these conductor track structures can be completely unnecessary and be absent in the present organic radiation-emitting component. In particular, in the case of the organic radiation-emitting component described here, it can be possible that it is not actually necessary to influence or adapt the conductivity of the first and/or the second electrode, but rather, on the contrary, the electrical resistance or the electrical conductivity of the first organic layer by means of the formation or arrangement of the abovementioned plurality of partial regions comprising the first and second materials.

In this case, the first organic functional layer has a first main surface facing the first electrode and a second main surface facing the active region. The partial regions comprising the first and second materials preferably extend from the first to the second main surface of the first organic functional layer and thus have a height that is equal to the thickness of the first organic functional layer. In this case, the partial regions can directly adjoin one another, such that the plurality of partial regions forms the first organic functional layer. Particularly preferably, partial regions arranged adjacent alongside one another have no visible interface, rather they merge into one another, such that the first organic functional layer in the organic radiation-emitting component can be embodied as a continuous layer. In this case, the individual partial regions can be distinguishable from one another on account of the respective proportion of the first material and of the second material or by the ratio of these proportions to one another.

In particular, the partial regions in the first organic functional layer can be formed and arranged in such a way that the ratio of the proportion of the second material to the proportion of the first material becomes greater as the lateral distance from the first electrical contact region increases. Since the first material has a lower electrical conductivity than the second material, that can mean, in particular, that the electrical conductivity of the partial regions becomes greater as the lateral distance from the first electrical contact region becomes greater. In the case of the organic radiation-emitting component described here, it has surprisingly been established that precisely as a result the partial resistance of (imaginary) different current paths between the first electrical contact region and the active region which have proportions of mutually different lengths of the (imaginary) current paths from the first electrical contact region through the first electrode into the first organic functional layer can be adapted to one another.

The first electrical contact region can be embodied in one of the abovementioned embodiments and have a point-, line- or area-like embodied contact area with the first electrode. In this case, in particular a contact area embodied in a line- or area-like fashion can extend along or else partly on a part of the first electrode. In this case, the first electrical contact region can have one or a plurality of regions which are linked together or are in electrical contact with the first electrode separately from one another. A "lateral distance from the first contact region" can thus denote, for example, an average lateral distance of a partial region of the first organic functional layer which is averaged over the lateral distances of all the electrical contact points between the first contact region and the first electrode. In this case, it is possible to use an arithmetic, a geometrical or some other suitable summing or integrating averaging method with imaginary discrete contact points of finite size or contact points assumed to be infinitesimally small. In particular, the first material and the second material, with regard to their respective proportions in the partial regions of the first organic functional layer, can have a distribution function or density that is dependent on the arrangement and configuration of the first contact region.

Each of the partial regions of the first organic functional layer can have a uniform distribution of the second material in the first material within the partial region. That can mean, for example, that a partial region can be subdivided into a plurality of imaginary identical volume elements and, in each of the volume elements, the ratio of the proportion of the second material to the proportion of the first material is identical to the corresponding ratio in the entire partial region. The imaginary volume elements can be, for example, layer regions or "small slices" arranged one above another perpendicularly to the main extension direction of the first organic functional layer.

Here and hereinafter, the ratio of the proportion of the second material to the proportion of the first material can be characterized as a ratio in proportions by volume, proportions by weight or molar proportions and can also be designated as "concentration" of the second material in the first material.

Furthermore, each of the partial regions of the first organic functional layer can in each case have a first functional region comprising the first and the second material and furthermore a second functional region comprising the first material. In this case, the volume concentration of the second material in relation to the first material in the first functional regions of different partial regions can be identical, while the second functional region of the partial regions is in each case free of the second material. In each case one first and one second functional region can, in particular, form a partial region, such that, in other words, each of the partial regions consists of exactly one first and one second functional region.

In particular, all the first functional regions of the partial regions can adjoin or form one and the same main surface, for example the main surface facing the first electrode, of the first organic functional layer, while all the second functional regions of the partial regions can adjoin or form the other main surface, for example the main surface facing the active region, of the first organic functional layer.

Furthermore, the first functional region of a partial region can have a first volume and the second functional region of a partial region can have a second volume. The respective ratio of the first volume to the second volume can become greater as the lateral distance from the first electrical contact region increases. In other words, that can mean that, as the lateral distance from the first contact region increases, the thickness of the first functional regions increases, while the thickness of the second functional regions decreases. As a result, within the partial regions, as the lateral distance from the first contact region increases, the proportion of the second material in relation to the proportion of the first material can increase, as a result of which it is possible to achieve an increase in the electrical conductivity of the partial regions as the lateral distance from the first electrical contact region increases, with the effects and advantages already described above.

The first functional regions of the partial regions of the first organic functional layer can furthermore form a first partial layer of the first organic functional layer, while the second functional regions form a second partial layer. An imaginary interface shaped in stepped fashion or a continuously curved imaginary interface can be formed between the first and second partial layers.

Furthermore, the first material can comprise an organic electrically conductive matrix material, into which the second material is introduced in the form of a dopant. In this case, in the organic radiation-emitting component described here, the designation "doping" should not be understood to be restrictive with regard to the concentration of the second material in relation to the first material. In particular, in a partial region, the proportion of the second material as "dopant" can be, for example, less than or equal to or else greater than the proportion of the first material as "matrix material".

The first material and the second material can together form so-called charge transfer complexes. That can mean that the first material and the second material form electron donor-acceptor complexes, the electrical and/or optical properties of which can be different from those of the first and second materials in each case by themselves. In this case, the charge transfer complexes can contribute, in particular, to the fact that the electrical conductivity in a partial region comprising the first and second materials is greater than the electrical conductivity of the first material by itself. Particularly preferably, the charge transfer complexes formed by the first and second materials have absorption bands lying outside the wavelength range of the electromagnetic radiation generated in the active region, such that the charge transfer complexes are preferably at least partly transparent to the electromagnetic radiation generated in the active region. By way of example, the charge transfer complexes can be at least transparent to visible light in the case of an organic radiation-emitting component for illumination purposes.

Here and hereinafter, "at least partly transparent" to a wavelength can mean, in particular, transparency of greater than or equal to 80%, and preferably of greater than or equal to 90%, and correspondingly an absorption of less than or equal to 20%, and particularly preferably of less than or equal to 10%, at said wavelength. Here and hereinafter, the visible wavelength range is in this case assumed with a wavelength range of between approximately 400 and approximately 700 nanometers.

Furthermore, a second organic functional layer comprising the first material can be arranged between the first organic functional layer and the active region, said second organic functional layer being free of the second material and directly adjoining the active region. As a result, a separation of the charge transfer complexes in the partial regions of the first organic functional layer from the active region can be possible, such that it is possible to prevent the charge transfer complexes of the first organic functional layer from suppressing the generation of electromagnetic radiation in the active region (so-called "quenching").

In particular, the first functional layer can be embodied as a charge carrier transport layer suitable for transporting charge carriers injected through the first electrode into the active region. In this case, the first functional layer can be embodied as a hole transport layer and/or as an electron transport layer.

Furthermore, the second electrode can also have a second electrical contact region for making electrical contact with the second electrode. In this case, the second electrical contact region can have one or more of the features described above in conjunction with the first electrical contact region. A third organic functional layer can be arranged between the active region and the second electrode, which third organic functional layer can have a plurality of laterally arranged partial regions each comprising a third material having a third electrical conductivity and a fourth material having a fourth electrical conductivity, wherein the fourth electrical conductivity is greater than the third electrical conductivity, and the ratio of the proportion of the fourth material to the proportion of the third material in the partial regions of the third organic functional layer varies in a manner dependent on a lateral distance from the first electrical contact region and/or in a manner dependent on a lateral distance from the second electrical contact region.

In this case, the third organic functional layer can have one or more of the features described above or below in connection with the first organic functional layer. Furthermore, the third material can have one or more of the features described above or below in connection with the first material, while the fourth material can have one or more of the features described above or below in connection with the second material.

The third organic functional layer embodied in this way in conjunction with the first organic functional layer described above makes it possible to further improve a targeted adaptation of the current density distribution in the active region for example in the case of large-area organic radiation-emitting components.

A fourth organic functional layer comprising the third material can be arranged between the active region and the third organic functional layer, said fourth organic functional layer being free of the fourth material and directly adjoining the active region. As a result, as already explained further above in connection with the second organic functional layer, it is possible to prevent "quenching" of the generation of the electromagnetic radiation in the active region by charge transfer complexes composed of the third and fourth materials.

If the first organic functional layer is embodied as a hole transport layer, then the third organic functional layer is preferably embodied as an electron transport layer. If the first organic functional layer is embodied as an electron transport layer, then the third organic functional layer is preferably embodied as a hole transport layer. The materials and features described below for the first organic functional layer and the first and respectively the second material correspondingly also hold true for the third organic functional layer and the third and respectively the fourth material, unless indicated otherwise.

The first material can be selected, depending on the embodiment of the first organic functional layer as a hole transport layer or as an electron transport layer, from a group comprising phenanthroline derivatives, imidazole derivatives, triazole derivatives, oxadiazole derivatives, phenyl-containing compounds, compounds comprising condensed aromatics, carbazole-containing compounds, fluorene derivatives, spirofluorene derivatives and pyridine-containing compounds and also combinations of at least two or more of the stated materials.

For a first organic functional layer embodied as a hole transport layer, in particular one or more of the following materials are suitable as first material:
N,N'-bis(naphthalen-1-yl)-N,N'W-bis(phenyl)benzidine (NPB),
N,N'-bis(naphthalen-2-yl)-N,N'-bis(phenyl)benzidine (β-NPB),
N,N'-bis(3-methylphenyl)-1,1'-bis(phenyl)-4,4'-diamine (TPD),
N,N'-bis(3-methylphenyl)-N,N'-bis(phenyl)-9,9-spirobifluorene (spiro-TPD),
N,N'-bis(naphthalen-1-yl)-N,N'-bis(phenyl)-9,9-spirobifluorene (spiro-NPB),
4,4',4''-tris(N-(naphth-1-yl)-N-phenylamino)triphenylamine (1-TNATA),
2,2',7,7'-tetrakis(N,n'-di-p-methylphenylamino)-9,9'-spirobifluorene (spiro-TTB),
N,N'-bis(3-methylphenyl)-N,N'-bis(phenyl)-9,9-dimethylfluorene (DMFL-TPD),
N,N'-bis(naphthalen-1-yl)-N,N'-bis(phenyl)-9,9-dimethylfluorene (DMFL-NPB),
N,N'-bis(3-methylphenyl)-N,N'-bis(phenyl)-9,9-diphenylfluorene (DPFL-TPD),
N,N'-bis(naphthalen-1-yl)-N,N'-bis(phenyl)-9,9-diphenylfluorene (DPFL-NPB),
2,2',7,7'-tetrakis(N,N-diphenylamino)-9,9'-spirobifluorene (spiro-TAD),
9,9-bis[4-(N,N-bisbiphenyl-4-ylamino)phenyl]-9H-fluorene (BPAPF),
9,9-bis[4-(N,N-bisnaphthalen-2-ylamino)phenyl]-9H-fluorene (NPAPF),
9,9-Bis[4-(N,N'-bisnaphthalen-2-yl-N,N'-bisphenyl-amino)phenyl]-9H-fluorene (NPBAPF),
2,2',7,7'-tetrakis[N-naphthalenyl(phenyl)amino]-9,9-spirobifluorene (spiro-2NPB),
N,N'-bis(phenanthren-9-yl)-N,N'-bis(phenyl)benzidine (PAPB),
2,7-bis[N,N-bis(9,9-spirobifluoren-2-yl)amino]-9,9-spirobifluorene (spiro-S),
2,2'-bis[N,N-bis(biphenyl-4-yl)amino]-9,9-spirobifluorene (2,2'-spiro-DBP),
2,2'-bis(N,N-diphenylamino)-9,9-spirobifluorene (spiro-BPA).

For a first organic functional layer embodied as an electron transport layer, in particular one or more of the following materials are suitable as first material:
8-hydroxyquinolinolato-lithium (Liq),
2,2',2''-(1,3,5-benzinetriyl)-tris(1-phenyl-1-H-benz-imidazole) (TPBi),
2-(4-biphenylyl)-5-(4-tert-butylphenyl)-1,3,4-oxadiazole (PBD),
2,9-dimethyl-4,7-diphenyl-1,10-phenanthroline (BCP),
4,7-diphenyl-1,10-phenanthroline (BPhen),
bis(2-methyl-8-quinolinolat)-4-(phenylphenolato)aluminum (BAlq),
1,3-bis[2-(2,2'-bipyridin-6-yl)-1,3,4-oxadiazo-5-yl]benzene (Bpy-OXD),
6,6'-bis[5-(biphenyl-4-yl)-1,3,4-oxadiazo-2-yl]-2,2'-bipyridyl (BP-OXD-Bpy),
3-(4-biphenylyl)-4-phenyl-5-tert-butylphenyl-1,2,4-triazole (TAZ),
4-(naphthalen-1-yl)-3,5-diphenyl-4H-1,2,4-triazole (NTAZ),
2,9-bis(naphthalen-2-yl)-4,7-diphenyl-1,10-phenanthroline (NBphen),
2,7-bis[2-(2,2'-bipyridin-6-yl)-1,3,4-oxadiazo-5-yl]-9,9-dimethylfluorene (Bby-FOXD), 1,3-bis[2-(4-tert-butylphenyl)-1,3,4-oxadiazo-5-yl]benzene (OXD-7).

By way of example, the first organic functional layer can be embodied as a hole transport layer. That can mean that the second material enables a p-type doping of the first material and the second material is embodied as electron pair acceptor material.

In this case, the second material can comprise or be a metal oxide, an organometallic compound, an organic material or a mixture thereof. Additionally or alternatively, the second material can comprise a plurality of different metal oxides and/or a plurality of different organometallic compounds and/or a plurality of different organic compounds. In particular, the second material can have Lewis acid character or be a Lewis acid. Lewis acids, that is to say electron pair acceptors, can be particularly suitable for forming charge transfer complexes.

The second material can comprise one or more metal oxides comprising one or more metals, wherein the metals are selected from tungsten, molybdenum, vanadium and rhenium. Particularly preferably, the dopant can comprise one or more of the metal oxides $WO_3$, $MoO_3$, $V_2O_5$, $Re_2O_7$ and $Re_2O_5$.

Furthermore, the second material can also comprise organometallic compounds having Lewis acid character. Particularly in the case of organometallic compounds or complexes having an impeller structure, the Lewis acid character of the axial position is particularly pronounced.

Furthermore, the organometallic compounds can comprise ruthenium and/or rhodium. By way of example, the second material can comprise as organometallic compound a trifluoroacetate (TFA), for example di-rhodium tetratrifluoroacetate ($Rh_2(TFA)_4$), the isoelectronic ruthenium compound $Ru_2(TFA)_2(CO)_2$ and/or 2,3,5,6-tetrafluoro-7,7,8,8-tetracyanoquinodimethane ($F_4TCNQ$).

Furthermore, the second material can comprise organic materials which have aromatic functional groups or are aromatic organic materials. In particular, the second material can comprise aromatic materials having a pronounced number of fluorine and/or cyanide (CN) substituents.

Furthermore, the first organic functional layer can be embodied as an electron transport layer. That can mean that the second material enables an n-type doping of the first material. In this case, the second material can comprise or be an alkali metal salt, an alkaline earth metal salt, an organometallic compound or a mixture thereof. Additionally or alternatively, the second material can comprise a plurality of different alkali metal salts and/or a plurality of different alkaline earth metal salts and/or a plurality of different organometallic compounds. Furthermore, the second material can also comprise a carbonate. Furthermore, the second material can particularly preferably comprise cesium or calcium.

Furthermore, the second material can comprise a metallocene, that is to say an organometallic compound comprising a metal M and two cyclopentadienyl radicals (Cp) in the form $M(Cp)_2$, for example chromocene and decamethylchromocene. Alternatively or additionally, the second material can also comprise a metal-hydropyrimidopyrimidine complex. The metal can comprise or be, for example tungsten, molybdenum and/or chromium. The second material can comprise, for example, organometallic compounds comprising 1,2,4,6,7,8-hexahydro-2H-pyrimido[1,2-a]pyrimidine (hpp) such as, for instance, $W_2(hpp)_4$, $Mo_2(hpp)_4$ and $Cr_2(hpp)_4$.

The abovementioned second materials can each have the property of producing free charge carriers in one of the first materials mentioned above, and thus increasing the electrical conductivity. The feature that the second electrical conductivity is higher than the electrical conductivity can also be understood in this sense in the present application.

The organic radiation-emitting component can furthermore have a substrate. In this case, the first electrode can be transparent and can be arranged on the substrate and between the substrate and the first organic functional layer. In this case, the substrate can likewise be transparent.

Consequently, the electromagnetic radiation generated in the active region can in this case be emitted through the substrate and the first electrode and the organic radiation-emitting component is embodied as a so-called "bottom emitter".

Furthermore, the first electrode can also be transparent and arranged above the active region as seen from the substrate. The electromagnetic radiation generated in the active region can in this case be emitted in an emission direction facing away from the substrate and the organic radiation-emitting component is embodied as a so-called "top emitter".

If the second electrode is also embodied in transparent fashion, the organic radiation-emitting component can also be embodied as emissive on both sides.

By way of example, the substrate can comprise glass, quartz, plastic films, metal, metal films, silicon wafers or some other suitable substrate material.

The first electrode can be embodied as an anode, for example, and thus serve as hole-injecting material. In this case, the first electrode can, for example, comprise a transparent conductive oxide or consist of a transparent conductive oxide. Transparent conductive oxides ("TCO" for short) are transparent conductive materials, generally metal oxides such as, for example, zinc oxide, tin oxide, cadmium oxide, titanium oxide, indium oxide or indium tin oxide (ITO). Alongside binary metal-oxygen compounds such as, for example, $ZnO$, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can also be p- or n-doped. Furthermore, a first electrode embodied as an anode can comprise or be composed of an electrically conductive polymer such as, for instance, polystyrenesulfone-doped polydiethoxythiophene (PEDOT:PSS) and/or camphorsulfonic-acid-doped polyaniline (PANI).

The organic layer sequence can comprise, alongside the materials mentioned above for the first and, if appropriate, for the second, third and/or fourth organic functional layer, further layers comprising organic polymers, organic oligomers, organic monomers, organic small, non-polymeric molecules ("small molecules") or combinations thereof. In this case, the organic layer sequence can have, in addition to the first and, if appropriate, the second, third and/or fourth organic functional layer, further functional layers such as, for instance, further charge carrier transport layers, charge carrier injection layers, charge carrier blocking layers and, as active region, electroluminescent layers. In this case, an electroluminescent layer can be suitable for generating electromagnetic radiation through recombination of electrons and holes. Depending on the materials in the functional layers and, in particular, in the active region of the organic layer sequence, the electromagnetic radiation generated can have individual wavelengths or ranges or combinations thereof from an ultraviolet to infrared wavelength range and particularly preferably from a visible wavelength range.

The second electrode can be embodied as a cathode and thus serve as electron-injecting material. Inter alia, in particular aluminum, barium, indium, silver, gold, magnesium, calcium or lithium and compounds, combinations and alloys thereof can prove to be advantageous as cathode material. In addition, the second electrode can have, on a side facing the organic functional layers, a layer comprising LiF, which has good electron injection properties. Alternatively or additionally, the second electrode can also comprise one of the abovementioned TCOs or a layer sequence composed of TCO layers and a metal layer. The second electrode can likewise be transparent.

Alternatively, the first electrode can also be embodied as a cathode and the second electrode as an anode.

The first and/or the second electrode can in each case be embodied in large-area fashion. As a result, a large-area emission of the electromagnetic radiation generated in the active region can be made possible. In this case, "large-area" can mean for the organic radiation-emitting component described here that the organic radiation-emitting component has an area of greater than or equal to a few square millimeters, preferably greater than or equal to one square centimeter, and particularly preferably greater than or equal to one square decimeter. Alternatively or additionally, the first and/or the second electrode can be embodied in structured fashion at least in partial regions. As a result, a structured emission of the electromagnetic radiation generated in the active region can be made possible, for instance in the form of pixels or pictograms.

The organic radiation-emitting component can have an encapsulation in the form of a glass cover and/or a multilayer thin-film encapsulation in order to achieve protection against moisture and/or oxidizing substances such as, for instance, oxygen for example for the first and second electrodes and the organic functional layers.

The use of a laterally varying ratio of the proportion of the second material to the proportion of the first material in the case of the organic radiation-emitting component described here makes it possible to obtain large-area illumination elements having a homogeneous light distribution over the entire area, without impairing the transparency of a first and/or second electrode embodied in transparent fashion. In contrast to known OLEDs, it is possible to reduce the number of additional auxiliary metallizations or even to dispense completely with the latter. Moreover, the setting of any desired brightness profiles can furthermore be possible.

In accordance with a further embodiment, a method for producing an organic radiation-emitting component comprises, in particular, the following steps:

A) providing the first electrode having the first electrical contact region,
B) applying the first organic functional layer comprising the plurality of laterally arranged partial regions comprising the first and second materials,
C) applying the active region on the first organic functional layer, and
D) applying the second electrode on the active region.

In particular, the method can be suitable for producing an organic radiation-emitting component comprising one or more of the features described above. All the features and advantages mentioned above in conjunction with the organic radiation-emitting component correspondingly also relate to the method described here.

In particular, in method step B, the first and second materials can be applied in such a way that the ratio of the second proportion to the first proportion becomes greater as the distance from the first electrical contact region increases. As a result, as described above, the electrical conductivity of the first organic functional layer can be increased in a targeted manner depending on the lateral distance from the first contact region.

By way of example, the first material and the second material, depending on the material form, that is to say polymers, oligomers, monomers and/or small molecules, can be applied on the first electrode by means of vapor deposition, printing, in particular screen printing, spin-coating or by means of some other suitable application method. The first material can be applied in large-area fashion, for example, while the second material can furthermore be applied for example by means of an adjustable diaphragm. Depending on the desired embodiment of the partial regions, the adjustable diaphragm can be, for example, a pinhole diaphragm or a slot diaphragm.

A second organic functional layer as described above can be applied in a further method step after method step B and before method step C.

Furthermore, after method step C and before method step D, a third organic functional layer as described above and/or a fourth organic functional layer as described above can be applied on the active region by means of one of the methods mentioned above.

BRIEF DESCRIPTION OF THE DRAWINGS

FIGS. 3 to 6 show schematic illustrations of organic radiation-emitting components in accordance with further exemplary embodiments.

DETAILED DESCRIPTION OF THE DRAWINGS

In the exemplary embodiments and figures, identical or identically acting constituent parts can in each case be provided with the same reference symbols. The elements illustrated and their size relationships among one another should not be regarded as true to scale, in principle; rather, individual elements such as, for example, layers, structural parts, components and regions may be illustrated with exaggerated thickness or size dimensions in order to enable better illustration and/or in order to afford a better understanding.

Figure 1:
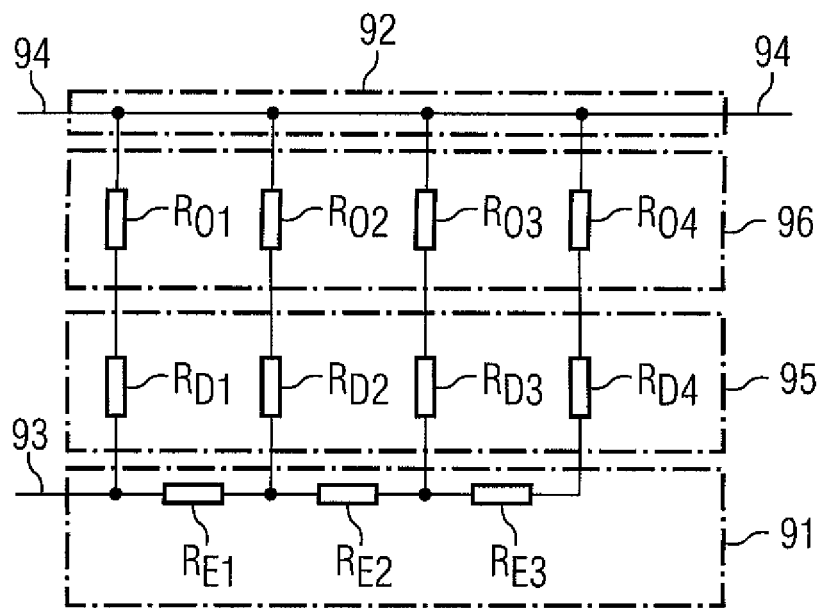
FIG. 1 shows an equivalent circuit diagram of an organic radiation-emitting component.

FIG. 1 shows an equivalent circuit diagram of an organic radiation-emitting component embodied as an organic light-emitting diode (OLED). In this case, the elements indicated by broken lines identify different functional elements and structural parts of the OLED in an embodiment shown purely by way of example.

The element identified by 91 represents a transparent electrode, which is connected to an external voltage and current supply (not shown) via an electrical connection 93. The element identified by 92 represents a reflective electrode, which is connected to the external voltage and current supply via electrical connections 94. Purely by way of example, an individual organic layer 95 and further organic layers 96 are arranged between the electrodes 91, 92. Furthermore, four imaginary current paths between the electrical connections 93 and 94 are indicated, which represent in a simplifying manner the current flow governed by the external current and voltage supply between the electrical connections 93 and 94.

The individual partial electrical resistances of the respective elements are depicted along the imaginary current paths. In this case, the partial resistances $R_{E1}$, $R_{E2}$ and $R_{E3}$ as a sum identify the total resistance of the transparent electrode along a main extension direction, which total resistance, as described in the general part, is caused by the material and the small thickness of the transparent electrode. For the sake of simplicity, identical partial resistances are in each case assumed between the imaginary current paths, that is to say $$R_{E1}=R_{E2}=R_{E3}.$$

In contrast thereto, in a simplifying manner, the electrode 92 is assumed to have a negligibly small resistance, for which reason no partial resistances are depicted between the current paths in the element 92.

Along the imaginary current paths, the individual organic layer 95 has the partial resistances $R_{D1}$, $R_{D2}$, $R_{D3}$ and $R_{D4}$ arranged in parallel with one another. The further organic layers 96 have partial resistances $R_{O1}$, $R_{O2}$, $R_{O3}$ and $R_{O4}$ arranged in parallel with one another, it being assumed that the further organic layers 96 are homogeneous with regard to their electrical properties, such that the following holds true:

$$R_{O1}=R_{O2}=R_{O3}=R_{O4}.$$

The total partial resistances along the imaginary current paths between the electrical connections 93 and 94 thus result from the sums of the respective partial resistances as $$R_1=R_{D1}+R_{O1},$$

$$R_2=R_{E1}+R_{D2}+R_{O2},$$

$$R_3=R_{E1}+R_{E2}+R_{D3}+R_{O3} \text{ and}$$

$$R_4=R_{E1}+R_{E2}+R_{E3}+R_{D4}+R_{O4}.$$

In the case of conventional OLEDs, all the organic layers are usually embodied in homogeneous fashion with regard to their electrical properties, such that the following holds true in the case of conventional OLEDs:

$$R_{D1}=R_{D2}=R_{D3}=R_{D4}.$$

However, it directly follows from this that $$R_1<R_2<R_3<R_4,$$

which means, in other words, that each of the imaginary current paths has a partial electrical resistance that is different from the other imaginary current paths. As explained in the general part, this leads to an inhomogeneous current density distribution in the organic layers and in this case in particular also in the electroluminescent layers, such that a known OLED constructed in this way has an inhomogeneous intensity distribution of the emitted light over the emission area of the OLED. In an OLED in accordance with the equivalent circuit diagram shown, the intensity of the emitted light would decrease from left to right with increasing distance from the electrical connection 93, which leads to the so-called "bathtub effect".

In contrast thereto, the organic radiation-emitting components in accordance with the embodiments in the general part and the following exemplary embodiments have partial resistances adapted in a targeted manner $$R_{D1}>R_{D2}>R_{D3}>R_{D4}$$

such that the following holds true for the organic radiation-emitting components in accordance with the following exemplary embodiments:

$$R_1=R_2=R_3=R_4.$$

In the case of the organic radiation-emitting components described here, this results in a homogeneous current density distribution in the active region, which can lead to a homogeneous emission intensity of the electromagnetic radiation generated.

Figure 2:
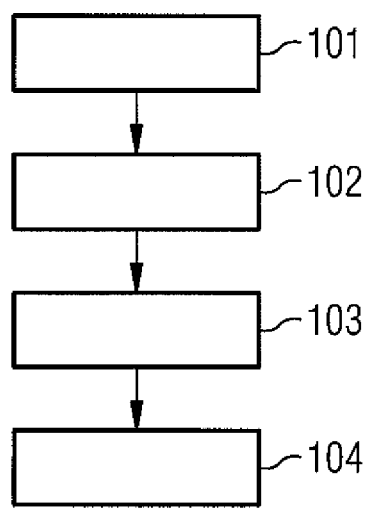
FIG. 2 shows a schematic illustration of a method for producing an organic radiation-emitting component in accordance with one exemplary embodiment.

Some methods for producing organic radiation-emitting components in accordance with different exemplary embodiments are described in FIG. 2 and in conjunction with the following figures.

For this purpose, in the methods described below, in accordance with the method in FIG. 2, a first electrode having a first electrical contact region is provided in each case in a first method step A identified by the reference symbol 101.

A further method step B identified by the reference symbol 102 involves applying a first organic functional layer comprising a plurality of laterally arranged partial regions comprising a first material having a first electrical conductivity and a second material having a second electrical conductivity. In this case, the ratio of the proportion of the second material to the proportion of the first material in the partial regions of the first organic functional layer varies in a manner dependent on a lateral distance from the first electrical contact region. Furthermore, the second electrical conductivity is greater than the first electrical conductivity.

A further method step C identified by the reference symbol 103 involves applying an organic active region on the first organic functional layer.

A further method step D identified by the reference symbol 104 involves applying a second electrode on the active region.

FIG. 3 shows an organic radiation-emitting component in accordance with one exemplary embodiment, which has a first electrode 1 on a substrate 6. The first electrode 1 has a first electrical contact region 10, which serves for making electrical contact with and electrically connecting the first electrode 1 to an external voltage and current supply (not shown). Here and in the following exemplary embodiments, the first electrical contact region 10 is embodied purely by way of example in the form of contact pads composed of metal which are arranged symmetrically around the first electrode 1. As an alternative thereto, other arrangements of the first electrical contact region in the form of point- line- or area-like contacts in symmetrical or asymmetrical arrangements are possible.

In the exemplary embodiment shown, the first electrode 1 comprises indium tin oxide (ITO) and is embodied in transparent fashion and as an anode. The substrate 6 is likewise embodied in transparent fashion and is composed of glass in the exemplary embodiment shown, such that electromagnetic radiation generated in the active region 4 described further below can be emitted from the organic radiation-emitting component, embodied as a "bottom emitter", through the first electrode 1 and the substrate 6.

A first organic functional layer 31 is applied on the first electrode 1. Furthermore, an active region 4 and a further organic functional layer 3 are applied on the first organic functional layer 31. A second electrode 2 is applied on the further organic functional layer 3, said second electrode, in the exemplary embodiment shown, being embodied as a reflective cathode and comprising aluminum.

An encapsulation for protecting the electrodes 1, 2 and the intervening layers 31, 4, 3 against moisture and oxygen is applied above the second electrode 2, said encapsulation not being shown for the sake of clarity.

In the exemplary embodiment shown, the active region 4 has three electroluminescent layers 41, 42, 43, which are suitable for emitting mutually differently colored electromagnetic radiation. By way of example, the electroluminescent layer 41 can emit blue light, the electroluminescent layer 42 green light and electroluminescent layer 43 red light, such that the organic radiation-emitting component shown can emit white-colored mixed light as a superimposition thereof during operation.

The further organic functional layer 3 is embodied as an electron transport layer, which is suitable for transporting electrons injected from the second electrode 2 into the active region.

In order to enable a homogeneous luminous impression over the entire emission area, which, in the exemplary embodiment shown, is given by the main surface of the substrate 6 which faces away from the active region 4, it is necessary for the current density distribution in the electroluminescent layers 41, 42 and 43 of the active region 4 to be homogeneous and not to bring about a "bathtub effect" described above.

For this purpose, the organic radiation-emitting component has the first organic functional layer 31 having a plurality of partial regions 30. In this case, the partial regions 30, which are indicated by the dashed lines, extend from the main surface of the first organic functional layer 31 which adjoins the first electrode 1 as far as the main surface which adjoins the active region and are arranged laterally along the main extension plane of the first organic functional layer 31. In this case, the partial regions 30, as described in the general part, are embodied in a manner merging into one another and without interfaces, such that the first organic functional layer 31 is embodied in continuous fashion. In FIG. 3 and in the following figures, the dimensions of the partial regions 30 are illustrated with an exaggerated size for the sake of clarity.

The first functional layer 31 is embodied as a hole transport layer and comprises a first material 51 having a first electrical conductivity and a second material 52 having a second electrical conductivity, wherein the second electrical conductivity is greater than the first electrical conductivity. In this case, the ratio of the proportion of the second material 52 to the proportion of the first material 51 in the partial regions 30 varies in a manner dependent on a lateral distance from the first electrical contact region 10.

In the exemplary embodiment shown, the first material 51 is N,N'-bis(naphthalen-1-yl)-N,N'-bis(phenyl)benzidine (NPB) and the second material is rhenium heptoxide ($Re_2O_7$). As an alternative or in addition thereto, the first and/or the second material 51, 52 can comprise one or more of the further materials presented in the general part. Since the first and the second material 51, 52 form charge transfer complexes, in the present exemplary embodiment the choice and combination of possible first and second materials 51, 52 are restricted to those which have no or only little absorption, that is to say, for instance, no charge transfer peak, in the visible wavelength range, since otherwise uniform transparency of the first organic functional layer would not be ensured on account of the variation of the ratio of the proportion of the second material 52 to the proportion of the first material 51 in the partial regions 30.

In this case, the first organic functional layer 31 is embodied in such a way that the ratio of the proportion of the second material 52 to the proportion of the first material 51 becomes greater as the lateral distance from the first electrical contact region 10 increases. On account of the arrangement of the first electrical contact region 10 as shown in the present exemplary embodiment, this means that, in the partial regions 30, the proportion of the second material 52 in relation to the proportion of the first material 51 is lower in the edge region of the organic radiation-emitting component and increases toward the center of the organic radiation-emitting component. In this case, each of the partial regions 30 of the first organic functional layer 31 has a uniform distribution of the second material in the first material within the partial region 30.

The partial regions 30 embodied in this way make it possible to reduce the electrical resistance of the first organic functional layer 31 toward the center, that is to say with increasing lateral distance from the first electrical contact region 10. This results in the effect explained in conjunction with FIG. 1, namely that the respective partial resistances of imaginary current paths between the first contact region 10 and the second electrode 2 are identical in magnitude or at least approximately identical in magnitude, as a result of which a homogeneous emission of the electromagnetic radiation generated in the active region is made possible. In this case, "approximately identical in magnitude" means a variation of less than 20%, and particularly preferably of less than 10%.

Since the first organic functional layer 31 has a uniform thickness, it can furthermore be ensured that no color shifts occur as a result of different cavity effects in different partial regions 30.

In order to produce the organic radiation-emitting component shown in FIG. 3, by means of a method in accordance with FIG. 2, method step A involved providing the first electrode 1 composed of structured ITO with the electrical contact region 10 on the glass substrate 6 with the dimensions 200 by 200 millimeters.

For method step B, in a vacuum receptacle, 500 milligrams of $Re_2O_7$ as source for the second material 52 were filled into an electrically heatable molybdenum boat lined with aluminum oxide and having a cover. A similar source for the first material 51 was prepared with NPB. Afterward, the substrate 6 with the first electrode 1 was fixed on a substrate holder approximately 60 centimeters away from the sources. A substrate diaphragm was arranged above the substrate 6 with the first electrode 1, which substrate diaphragm was initially closed. The source for the second material 52 likewise had a diaphragm in the form of a pinhole diaphragm.

The source for the first material 51 was set to a growth rate of 1 nanometer per second, and the source for the second material was set to a growth rate of 0.1 nanometer per second for a doping ratio of 10 to 1. Afterward, the substrate diaphragm was completely opened and a total of 30 nanometers of rhenium-heptoxide-doped NPB were deposited in a manner controlled by means of a substrate layer thickness monitor. For this purpose, the diaphragm of the source for the second material 52 was firstly completely opened in order to deposit a layer having a thickness of 5 nanometers with a uniform ratio of the proportion of the second material to the proportion of the first material.

Afterward, the diaphragm of the second source was closed and opened at a rate of 1 millimeter per second in order to achieve a ratio of the proportion of the second material 52 to the proportion of the first material 51 that decreases toward the edge regions of the first organic functional layer 31. After complete opening of the diaphragm of the second source, the first organic functional layer 31 was completed.

In further method steps C and D, the active region 4, the further organic functional layer 3 and the second electrode 2 were applied and the layer sequence of the organic radiation-emitting component was subsequently encapsulated.

The organic radiation-emitting component produced in this way and embodied as a "bottom emitter" exhibited a homogeneous luminous intensity over the entire emission area.

In accordance with a further exemplary embodiment, an organic radiation-emitting component was produced which comprised $F_4TCNQ$ instead of rhenium heptoxide as second material 52 and which likewise exhibited a homogeneous luminous intensity over the entire emission area.

As an alternative to the exemplary embodiment shown in FIG. 3 and the method described in conjunction therewith, and also in the further exemplary embodiments, it is also possible for the first electrode 1 to be embodied in reflective fashion and the second electrode 2 in transparent fashion, or for both electrodes 1, 2 to be embodied in transparent fashion. Furthermore, the first electrode 1 can be embodied as a cathode and the second electrode 2 as an anode, and the first organic functional layer 31 can be embodied as an electron transport layer comprising a first and second material 51, 52 in accordance with the description in the general part. Furthermore, the electrodes 1, 2, the first organic layer 31, the active region 4 and the further organic layer 3 can be arranged in the opposite order on the substrate 6. Furthermore, further organic functional layers such as, for instance, charge carrier blocking layers can also be applied. Alternatively, the active region 4 can also have more or fewer electroluminescent layers. If the first electrical contact region 10 has a different arrangement than that shown in FIG. 3 and in the following figures or if the intention is to achieve a specific luminance distribution that differs from the described luminance distribution that is as homogeneous as possible, then the distribution of the first and second materials 51, 52 in the partial regions 30 of the first organic functional layer 31 can deviate from that described above. All this also applies to the further exemplary embodiments, without the need for this to be pointed out separately in the case of said further exemplary embodiments.

FIG. 4 shows an organic radiation-emitting component in accordance with a further exemplary embodiment, in which the first organic functional layer 31 was applied by means of the vapor deposition method described above. The organic radiation-emitting component shown in FIG. 4 has a second organic functional layer 32 comprising the first material 51 between the active region 4 and the first organic functional layer 31. In this case, the second organic functional layer 32 is free of the second material 52 and directly adjoins the active region 4. The second organic functional layer 32 makes it possible to avoid suppression ("quenching") of the emission of electromagnetic radiation in the active region 4 by the charge transfer complexes composed of the first material 51 together with the second material 52 in the first organic functional layer 31, as a result of which the efficiency of the organic radiation-emitting component can be improved.

In accordance with further exemplary embodiments, organic radiation-emitting components were produced as "top emitters" with the fundamental construction in each case of the organic radiation-emitting components from FIGS. 3 and 4, in which the first electrode 1 was made from aluminum and embodied as a cathode. For this purpose, firstly an aluminum layer having a thickness of 150 nanometers was applied as first electrode 1 on the substrate 6 by vapor deposition.

Analogously to the method step B described above, in a corresponding method step B, a first organic functional layer 31 was applied as an electron transport layer, which comprised 2,9-dimethyl-4,7-diphenyl-1,10-phenanthroline (BCP) as first material and cesium carbonate as second material.

In further method steps C and D, the active region 4, a further functional layer 3 embodied as a hole transport layer and a transparent second electrode 2 embodied as an anode were applied.

Figure 5:
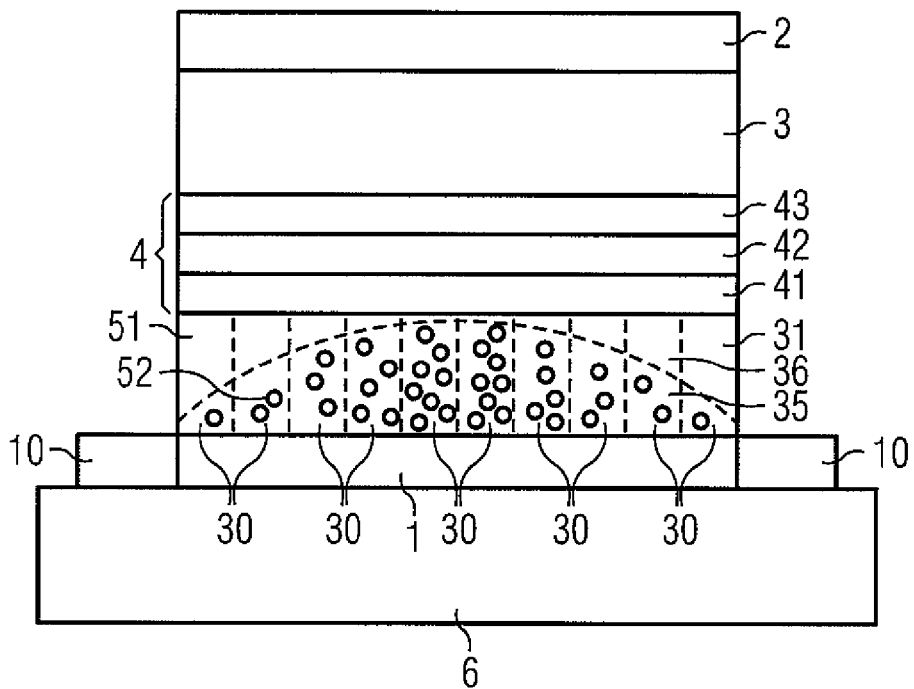

FIG. 5 shows an organic radiation-emitting component in accordance with a further exemplary embodiment.

In contrast to the organic radiation-emitting component in FIG. 3, the component in accordance with the exemplary embodiment in FIG. 5 has a first organic function layer 31, in which each of the partial regions 30 has a first functional region 35 and a second functional region 36, as is indicated by the dashed line. In each partial region 30, in this case the first functional region 35 comprises the first and second materials 51, 52 in a uniform volume concentration and distribution, while the second functional region 36 comprises only the first material 51 and is free of the second material. Furthermore, the ratio of the proportion of the second material 52 to the proportion of the first material 51 is identical in each of the first functional regions 35.

The first functional region 35 and the second functional region 36 of each partial region 30 has a first volume and a second volume, respectively. In this case, the partial regions 30 are embodied in such a way that the ratio of the first volume to the second volume becomes greater as the lateral distance from the first electrical contract region increases. What can be achieved as a result is that the partial regions 30, depending on the lateral distance from the first electrical contact region 10, have an increasing proportion of the second material 52 in relation to the proportion of the first material 51.

In other words, this means that the first functional regions 35 of the partial regions 30 form a first functional layer comprising the first and second materials 51, 52 which increases in thickness as the lateral distance from the first electrical contact region 10 increases. The second functional regions 36 of the partial regions 30 correspondingly form a second functional layer, the thickness of which decreases in thickness as the lateral distance from the first electrical contact region 10 increases. In this case, the thickness of the first organic functional layer 31 is uniformly thick and independent of the lateral distance from the first electrical contact region 10. What can be ensured as a result is that no color shifts are brought about as a result of possible different cavity effects on account of different distances between the active region 4 and the first electrode 1.

Figure 6:
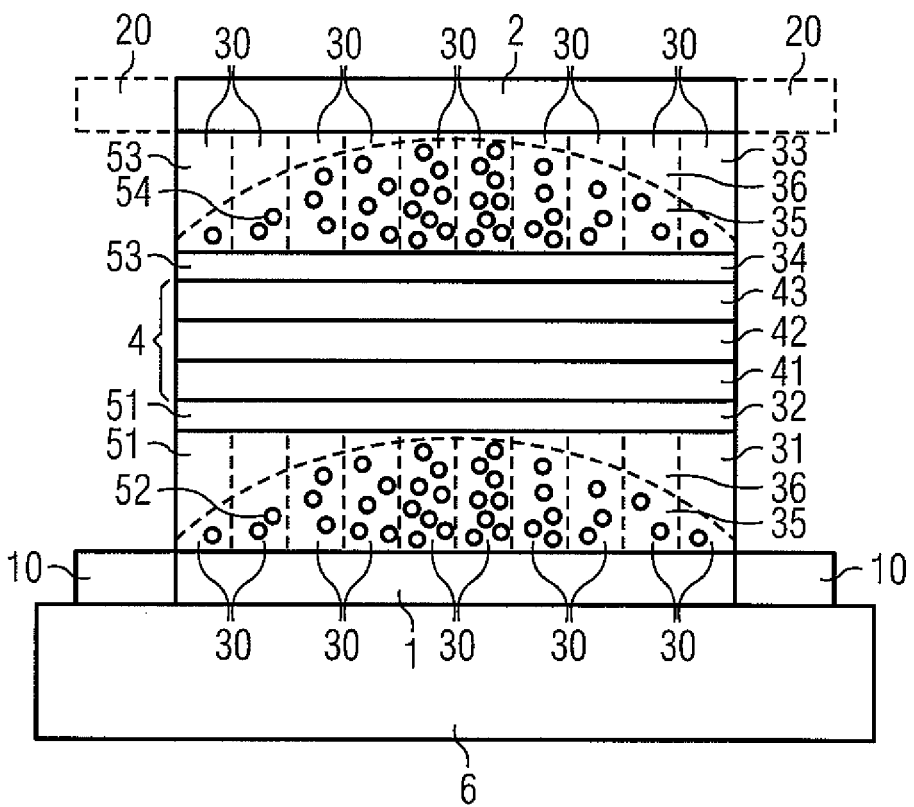

FIG. 6 shows an organic radiation-emitting component in accordance with a further exemplary embodiment, which has a first organic functional layer 31 as in the preceding exemplary embodiment. In addition, the organic radiation-emitting component shown here has a second organic functional layer 32 comprising only the first material 51.

Arranged above the active region 4 is a third organic functional layer 33 comprising a plurality of laterally arranged partial regions 30 comprising a third material 53 having a third electrical conductivity and a fourth material 54 having a fourth electrical conductivity. In this case, the fourth electrical conductivity is greater than the third electrical conductivity. The third organic functional layer 33 is embodied analogously to the first organic functional layer 31 with regard to its construction and, in the exemplary embodiment shown, likewise has first functional regions 35 comprising the third and fourth materials 53, 54 and second functional regions 36 comprising the third material. In this case, the second functional regions 36 of the third organic functional layer are free of the fourth material. As a result, in the third organic functional layer 33, too, the ratio of the proportion of the fourth material 54 to the proportion of the third material 53 in the partial regions 30 varies depending on a lateral distance from the first electrical contact region 10 and/or depending on a lateral distance from a second electrical contact region 20 of the second electrode 2, which is indicated by the dashed lines.

A fourth organic functional layer 34 is arranged between the active region 4 and the third organic functional layer 33, said fourth organic functional layer comprising the third material 53 and being free of the fourth material 54. The fourth organic functional layer directly adjoins the active region 4. As a result, the fourth organic functional layer 34 is suitable for avoiding a possible "quenching" in the active region 4 by means of the charge transfer complexes of the third material 53 together with the fourth material 54.

In the exemplary embodiment shown, the organic radiation-emitting component comprises NPB and $Re_2O_7$ as first and second material 51, 52, respectively, and BCP and cesium carbonate as third and fourth material 53, 54, respectively.

The organic radiation-emitting component in accordance with FIG. 6 is particularly suitable for enabling a very large emission area with a homogeneous luminous intensity since it is possible to set the partial resistances of the possible current paths between the first electrical contact region 10 and the second electrode 2 or the second electrical contact region 20 by means of the distribution of the first and second materials 51, 52 in the first organic functional layer 31 and additionally by means of the third and fourth materials 53, 54 in the third organic functional layer 33.

Figure 7:
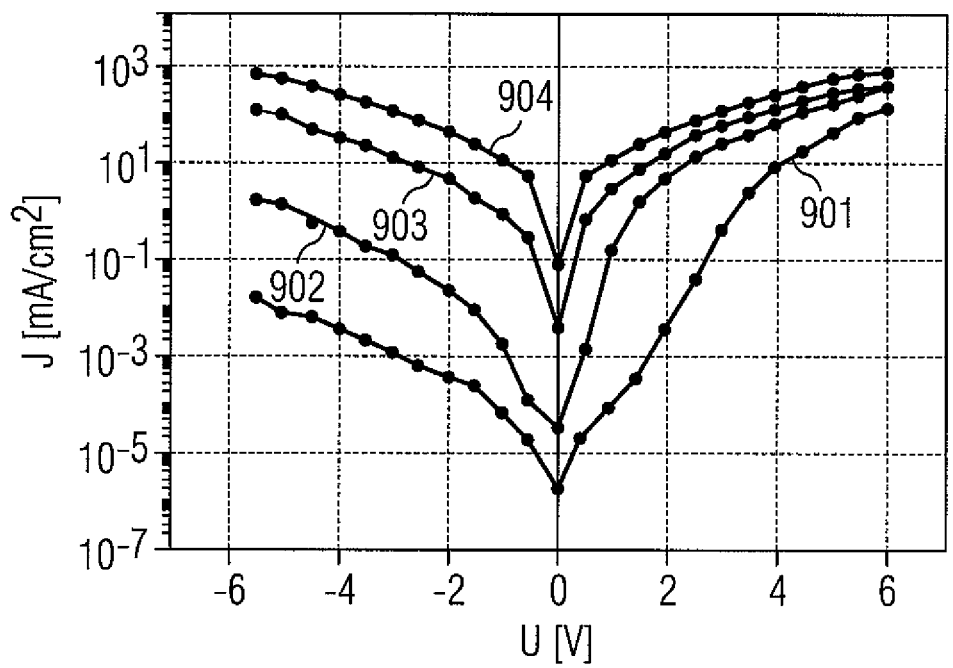
FIGS. 7 to 9 show graphs with measurements of electrical and optical properties of organic functional layers in accordance with further exemplary embodiments.
Figure 8:
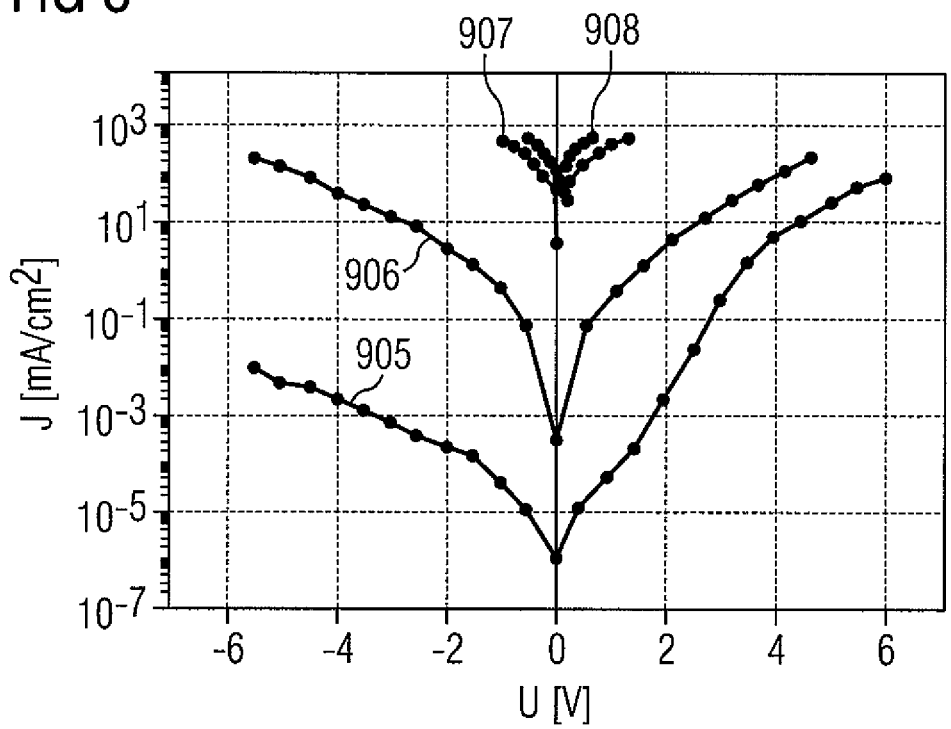

FIGS. 7 and 8 illustrate measurement curves regarding current densities (in milliamperes per square centimeter) in organic functional layers as a function of the respectively applied voltage (in volts), which show purely by way of example the change in the electrical conductivity depending on the ratio of the proportion of the second material to the proportion of the first material. In the measurement curves shown, it seems as though finite current densities different than zero would in each case be achievable at a voltage of 0 volts. However, this is a measurement artifact—known to the person skilled in the art—on account of the respective measurement inaccuracy and, in particular, on account of the semilogarithmic representation of the measurement curves.

Organic functional layers having a thickness of 150 nanometers and comprising NPB as first material were produced in the measurements for both of FIGS. 7 and 8.

For the measurement curves in FIG. 7, $F_4TCNQ$ was used as second material. In this case, the measurement curves 901, 902, 903 and 904 show the respectively achievable current densities for the first material by itself (901) and for a ratio of the proportion of the second material to the proportion of the first material of 1% (902), of 4% (903) and of 10% (904).

For the measurement curves in FIG. 8, $MoO_3$ was used as second material. In this case, the measurement curves 905, 906, 907 and 908 show the respectively achievable current densities for the first material by itself (905) and for a ratio of the proportion of the second material to the proportion of the first material of 1% (906), of 10% (907) and of 50% (908).

It can readily be discerned from both figures that, as a result of an increasing ratio of the proportion of the second material to the proportion of the first material, an increasing current density is achievable, which is owing to a correspondingly decreasing electrical resistance or an increasing electrical conductivity.

Figure 9:
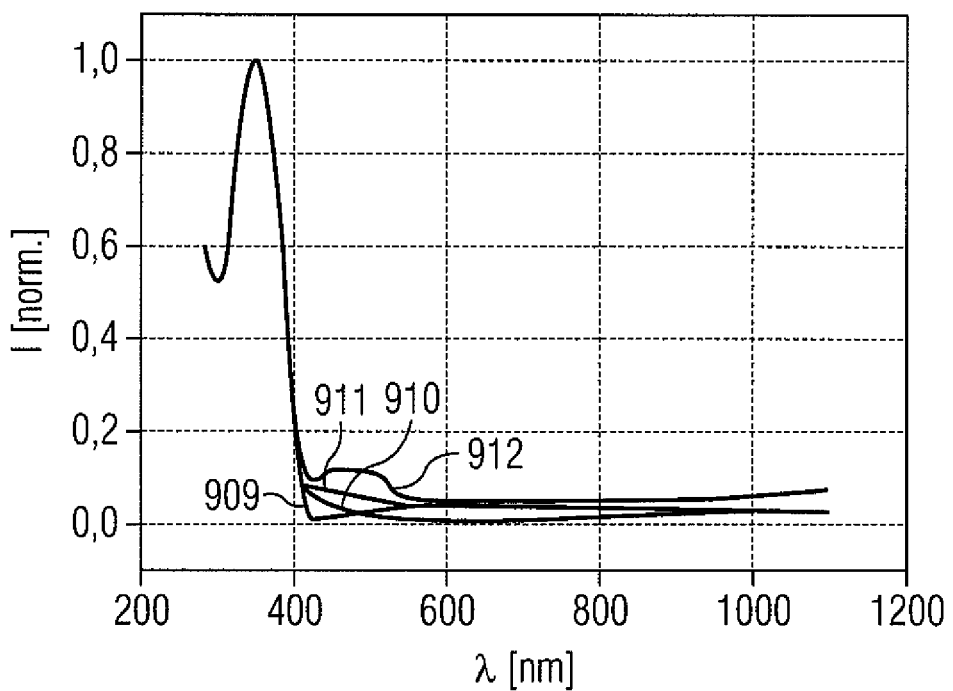

FIG. 9 shows measurement curves with regard to the transparency (as normalized intensity) of organic functional layers comprising a first and a second material as a function of the wavelength (in nanometers) in an ultraviolet to infrared wavelength range. A UV spectrum transmitted through the organic functional layers was measured for this purpose.

The first material was NPB for all the measurements, while the second material was $Re_2O_7$ in different proportions. The measurement curves 909, 910, 911 and 912 show the respectively transmitted proportion of the UV spectrum for the first material by itself (909) and for a ratio of the proportion of the second material to the proportion of the first material of 1% (910), of 10% (911) and of 50% (912).

It can readily be discerned from the measurement curves 909, 910, 911 and 912 that the transparency of the organic functional layers changes only insignificantly depending on the ratio of the proportion of the second material to the proportion of the first material, which can lead to a homogeneous luminous impression in the organic radiation-emitting components described above.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An organic radiation-emitting component, comprising:
    a first electrode having a first electrical contact region for making electrical contact with the first electrode;
    a first organic functional layer on the first electrode;
    on the first organic functional layer at least one organic active region suitable for emitting electromagnetic radiation during operation; and
    a second electrode on the active region,
    wherein the first organic functional layer comprises a plurality of laterally arranged partial regions each comprising a first material having a first electrical conductivity and a second material having a second electrical conductivity,
    wherein the second electrical conductivity is greater than the first electrical conductivity, and
    wherein the ratio of the proportion of the second material to the proportion of the first material in the partial regions of the first organic functional layer varies in a mariner dependent on a lateral distance from the first electrical contact region.

2. The component according to claim 1, wherein the ratio of the proportion of the second material to the proportion of the first material becomes greater as the lateral distance from the first electrical contact region increases.

3. The component according to claim 1, wherein each of the partial regions of the first organic functional layer has a uniform distribution of the second material in the first material within the partial region.

4. The component according to any of claim 1, wherein:
    each of the partial regions of the first organic functional layer has a first functional region comprising the first and the second material and a second functional region comprising the first material,
    the volume concentration of the second material in relation to the first material in the first functional regions of different partial regions is identical, and
    the second functional region of the partial regions is free of the second material.

5. The component according to claim 4, wherein:
    the first functional region has a first volume and the second functional region has a second volume, and
    the ratio of the first volume to the second volume becomes greater as the lateral distance from the first electrical contact region increases.

6. The component according to claim 1, wherein:
    the first material comprises an organic electrically conductive matrix material, and
    the second material is introduced as a dopant in the first material.

7. The component according to claim 1, wherein the first and second materials together form charge transfer complexes.

8. The component according to claim 7, wherein the charge transfer complexes are at least partly transparent to the electromagnetic radiation generated in the active region.

9. The component according to claim 1, wherein a second organic functional layer comprising the first material is arranged between the first organic functional layer and the active region, said second organic functional layer being free of the second material and directly adjoining the active region.

10. The component according to claim 1, wherein the first organic functional layer is embodied as a hole transport layer and/or as an electron transport layer.

11. The component according to claim 1, wherein:
    the second electrode has a second electrical contact region for making electrical contact with the second electrode, a third organic functional layer is arranged between the active region and the second electrode, the third organic functional layer comprises a plurality of laterally arranged partial regions each comprising a third material having a third electrical conductivity and a fourth material having a fourth electrical conductivity, the fourth electrical conductivity is greater than the third electrical conductivity, and the ratio of the proportion of the fourth material to the proportion of the third material in the partial regions of the third organic functional layer varies in a manner dependent on a lateral distance from the first electrical contact region and/or in a manner dependent on a lateral distance from the second electrical contact region.

12. A method for producing an organic radiation-emitting component according to claim 1, comprising the steps of:

A) providing the first electrode having the first electrical contact region,

B) applying the first organic functional layer comprising the plurality of laterally arranged partial regions comprising the first and second materials, C) applying the active region on the first organic functional layer, and D) applying the second electrode on the active region.

13. The method according to claim 12, wherein in method step B, the first and second materials are applied in such a way that the ratio of the proportion of the second material to the proportion of the first material becomes greater as the distance from the first electrical contact region increases.

14. The method according to claim 12, wherein in method step B, the second material is applied by means of an adjustable diaphragm.

15. The method according to claim 14, wherein the adjustable diaphragm is a pinhole diaphragm.

* * * * *

UNITED STATES PATENT AND TRADEMARK OFFICE
CERTIFICATE OF CORRECTION

PATENT NO. : 8,461,579 B2  
APPLICATION NO. : 13/127229  
DATED : June 11, 2013  
INVENTOR(S) : Christoph Gärditz et al.

Page 1 of 1

It is certified that error appears in the above-identified patent and that said Letters Patent is hereby corrected as shown below:

In the Claims:

Col. 20, in claim 1, line 18, change "mariner" (last word) to --manner--.

Signed and Sealed this  
First Day of October, 2013

Teresa Stanek Rea  
*Deputy Director of the United States Patent and Trademark Office*